(12) United States Patent
Leon et al.

(10) Patent No.: US 7,935,665 B2
(45) Date of Patent: *May 3, 2011

(54) NON-CORROSIVE CLEANING COMPOSITIONS FOR REMOVING ETCH RESIDUES

(75) Inventors: Vincent G. Leon, Scottsdale, AZ (US); Michelle Elderkin, Coventry, RI (US); Lawrence Ferreira, Fall River, MA (US)

(73) Assignee: Fujifilm Electronic Materials U.S.A., Inc., North Kingstown, RI (US)

(*) Notice: Subject to any disclaimer, the term of this patent is extended or adjusted under 35 U.S.C. 154(b) by 645 days.

This patent is subject to a terminal disclaimer.

(21) Appl. No.: 10/421,506

(22) Filed: Apr. 24, 2003

(65) Prior Publication Data

US 2003/0235996 A1   Dec. 25, 2003

Related U.S. Application Data

(60) Provisional application No. 60/375,613, filed on Apr. 25, 2002.

(51) Int. Cl.
*C11D 1/00* (2006.01)
*C11D 3/20* (2006.01)
*C11D 3/26* (2006.01)
*C11D 3/43* (2006.01)

(52) U.S. Cl. ....... 510/176; 510/175; 510/245; 510/255; 510/258; 510/477; 510/488; 510/505; 510/506

(58) Field of Classification Search .......... 510/175, 510/176, 245, 255, 258, 477, 488, 505, 506
See application file for complete search history.

(56) References Cited

U.S. PATENT DOCUMENTS

| | | | |
|---|---|---|---|
| 3,003,898 A | 10/1961 | Reich | 134/22 |
| 3,166,444 A | 1/1965 | Ehren et al. | 134/3 |
| 3,696,044 A | 10/1972 | Rutledge | 252/180 |
| 4,264,418 A | 4/1981 | Wood et al. | 204/129.95 |
| 5,691,117 A | 11/1997 | Lutsic et al. | |
| 5,909,742 A | 6/1999 | Ouyang et al. | 134/3 |
| 5,972,862 A * | 10/1999 | Torii et al. | 510/175 |
| 5,977,041 A | 11/1999 | Honda | 510/175 |
| 5,977,054 A * | 11/1999 | Wierenga | 510/503 |
| 6,033,993 A | 3/2000 | Love, Jr. et al. | 438/745 |
| 6,110,881 A * | 8/2000 | Lee et al. | 510/175 |
| 6,143,705 A * | 11/2000 | Kakizawa et al. | 510/175 |
| 6,147,002 A | 11/2000 | Kneer | 438/692 |
| 6,221,823 B1 | 4/2001 | Crisanti et al. | |
| 6,231,677 B1 | 5/2001 | Ishikawa et al. | 134/3 |
| 6,231,678 B1 | 5/2001 | Arruda et al. | |
| 6,239,092 B1 | 5/2001 | Papasso et al. | |
| 6,265,781 B1 | 7/2001 | Andreas | 257/765 |
| 6,323,168 B1 | 11/2001 | Kloffenstein et al. | 510/175 |
| 6,361,712 B1 | 3/2002 | Honda et al. | 252/79.3 |
| 6,372,050 B2 | 4/2002 | Honda et al. | 134/3 |
| 6,410,494 B2 | 6/2002 | Kakizawa et al. | |
| 6,413,923 B2 | 7/2002 | Honda et al. | 510/175 |
| 6,419,755 B1 | 7/2002 | Arruda et al. | |
| 6,498,131 B1 | 12/2002 | Small et al. | 510/175 |
| 6,503,334 B2 | 1/2003 | Ruiz et al. | 134/18 |
| 6,514,921 B1 | 2/2003 | Kakizawa et al. | 510/175 |
| 6,589,439 B2 | 7/2003 | Honda et al. | 216/107 |
| 7,001,874 B2 * | 2/2006 | Honda et al. | 510/176 |
| 2001/0023127 A1 | 9/2001 | Andreas | 438/623 |
| 2001/0051597 A1 | 12/2001 | Kato et al. | 510/175 |
| 2002/0132745 A1 * | 9/2002 | Honda et al. | 510/175 |
| 2003/0084919 A1 | 5/2003 | Tai et al. | |
| 2003/0096500 A1 | 5/2003 | Kneer | |
| 2003/0199406 A1 | 10/2003 | Anzures et al. | |
| 2006/0166846 A1 | 7/2006 | Li et al. | |

FOREIGN PATENT DOCUMENTS

| | | |
|---|---|---|
| EP | 0131525 | 12/1984 |
| JP | 59230080 | 12/1984 |
| JP | 07-286172 | * 10/1995 |
| JP | 2000087083 | 3/2000 |
| JP | 2000319699 | 11/2000 |
| JP | 2004506322 | 2/2004 |
| JP | 2004531637 | 10/2004 |
| WO | WO 00/72363 A1 | 11/2000 |
| WO | WO 0136578 | 5/2001 |
| WO | WO 0149796 A1 | 7/2001 |
| WO | WO 02/13242 | 2/2002 |

OTHER PUBLICATIONS

Supplementary European Search Report, Aug. 1, 2005.

* cited by examiner

*Primary Examiner* — Gregory R Del Cotto
(74) *Attorney, Agent, or Firm* — Fish & Richardson P.C.

(57) ABSTRACT

A non-corrosive cleaning composition that is aqueous-based, non-hazardous and will not harm the environment and is useful primarily for removing both fresh and aged plasma etch residues from a substrate. The composition comprises (a) water; and (b) a synergistic combination of at least one tricarboxylic acid and at least one carboxylic acid. Preferably, the at least one carboxylic acid has a pKa value ranging from 3 to 6. Also, a method for removing etch residues from a substrate. The method includes the steps of (a) providing a substrate with etch residue; and (b) contacting the substrate with a cleaning composition comprising water; and a synergistic combination of at least one tricarboxylic acid and at least one carboxylic acid.

26 Claims, No Drawings

NON-CORROSIVE CLEANING COMPOSITIONS FOR REMOVING ETCH RESIDUES

RELATED APPLICATION

This application claims priority from Provisional Patent Application Ser. No. 60/375,613, filed on Apr. 25, 2002.

BACKGROUND OF THE INVENTION

1. Field of the Invention

The present invention relates to a novel cleaning composition for use in microelectronics manufacturing. More particularly, the present invention relates to a non-corrosive cleaning composition for removing plasma etch residues formed on wafer substrates after plasma etching of metal layers or dielectric material layers deposited on the substrates.

2. Brief Description of the Prior Art

In the manufacture of microcircuits, photoresists are used as an intermediate mask for transferring an original mask pattern of a reticle onto wafer substrates by means of a series of photolithography and plasma etching steps. One of the final steps in the microcircuit manufacturing process is the removal of the patterned photoresist films from the substrates. In general, this step is affected by one of two methods.

One method involves a wet stripping step in which the photoresist-covered substrate is brought into contact with a photoresist stripper solution that consists primarily of an organic solvent and an amine. However, stripper solutions cannot completely and reliably remove the photoresist films, especially if the photoresist films have been exposed to UV radiation and plasma treatments during fabrication. Some photoresist films become highly crosslinked by such treatments and are more difficult to dissolve in the stripper solution. In addition, the chemicals used in these conventional wet-stripping methods are sometimes ineffective for removing inorganic or organometallic residual materials formed during the plasma etching of metal or oxide layers with halogen-containing gases.

An alternative method of removing a photoresist film involves exposing a photoresist-coated wafer to oxygen-based plasma in order to burn the resist film from the substrate surface in a process known as plasma ashing. However, plasma ashing is also not fully effective in removing the plasma etching by-products noted above. Instead removal of these plasma etch by-products must be accomplished by subsequently exposing the processed metal and dielectric thin films to certain cleaning solutions.

In a typical process, an antireflective coating such as DUV 30® (Brewer Science) is spin coated onto a damascene thin film stack then baked. A photoresist film is then applied by spin coating on top of the antireflective coating and is then pre-exposure baked. The photoresist is pattern-wise exposed using ultraviolet radiation, post-exposure baked, then developed in a dilute aqueous alkaline developer solution and subsequently rinsed with de-ionized water and spun-dried. The developed pattern is then transferred by reactive ion etching into the lower layers of the substrate's film stack. The photoresist and remaining antireflective coating are removed by plasma ashing techniques. Unwanted residues remain on the substrate as a result of the plasma ashing process.

Metal substrates are generally susceptible to corrosion. For example, substrates such as aluminum, copper, aluminum-copper alloy, tungsten nitride, and other metals and metal nitrides will readily corrode by using conventional cleaning chemistries. This is due to the high alkalinity of the conventional cleaning solutions.

Therefore, there remains a need for new types of cleaning compositions for removing plasma etch residues from substrates. Additionally, there remains a need for such a cleaning composition that does not deleteriously affect the substrate. Further, there remains a need for such a cleaning composition that is aqueous-based, non-hazardous and will not harm the environment. All of these concerns are addressed by the cleaning composition of the present invention, which is not only non-corrosive, but is also capable of effectively removing fresh and aged residues from a substrate.

SUMMARY OF THE INVENTION

The present invention is directed to a non-corrosive cleaning composition that is aqueous-based, non-hazardous and will not harm the environment and is useful primarily for removing both fresh and aged plasma etch residues from a substrate. The composition comprises (a) water; and (b) a synergistic combination of tricarboxylic acid and carboxylic acid. Optionally, hydroxylammonium compound may be included in the composition.

The present invention is also directed to a method for removing etch residues from a substrate. The method comprises the steps of (a) providing a substrate with etch residue; and (b) contacting the substrate with a cleaning composition comprising water; and a synergistic combination of tricarboxylic acid and carboxylic acid.

DETAILED DESCRIPTION OF THE INVENTION

References herein to pKa values can be found in the chemical literature such as *Lange's Handbook of Chemistry*, 15$^{th}$ Edition, 1999 published by McGraw-Hill, Inc.

The term "fresh substrate", as used herein, refers to substrates that have been stored at ambient temperature for no longer than 2 weeks following the plasma ashing process.

The term "aged substrates", as used herein, refers to substrates that have been stored at ambient temperature for longer than 2 weeks, and typically about 30-45 days following the plasma ashing process. One skilled in the art will realize that such "aged" plasma ash residues are particularly difficult to remove.

The present invention provides a cleaning composition that effectively cleans both a fresh metal substrate and an aged metal substrate without promoting corrosion of the metal substrate because of its weak acidic formulation.

The cleaning composition of the present invention is an aqueous solution with a synergistic combination of at least one tricarboxylic acid having formula (I) below and at least one carboxylic acid with a pKa value ranging from 3 to 6 having formula (II) below:

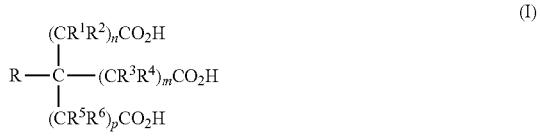

wherein n, m, and p, are each integers independently ranging from 1 to 6; q is an integer ranging from 0 to 6; R, R$^1$, R$^2$, R$^3$, $R^4$, $R^5$, $R^6$, $R^7$, and $R^8$ are each independently selected from the group consisting of hydrogen, hydroxyl, mercapto, alicyclic or cyclic thioethers having 1 to 6 carbon atoms, lower alkoxy groups having 1 to 4 carbon atoms, lower branched or linear alkyl groups having 1 to 4 carbon atoms, cyclic alkyl groups having 3 to 6 carbon atoms, phenyl, aryl, nitro and halogen; and $R^9$ is selected from the group consisting of hydrogen, carboxylic acid, hydroxyl, mercapto, alicyclic or cyclic thioethers having 1 to 6 carbon atoms, lower alkoxy groups having 1 to 4 carbon atoms, lower branched or linear alkyl groups having 1 to 4 carbon atoms, cyclic alkyl groups having 3 to 6 carbon atoms, phenyl, aryl, nitro and halogen.

Suitable tricarboxylic acids having formula (I) include, for example, tricarballylic acid, beta-methyltricarballylic acid, citric acid, nitromethanetrispropionic acid, and 2-(carboxylmethylthio) succinic acid. Preferred tricarboxylic acids include, for example, citric acid, (carboxylmethylthio) succinic acid, and tricarballylic acid.

Tricarboxylic acid is present in the cleaning composition of the present invention in an amount about 0.01 wt. % to about 10.0 wt. %, based on the total weight of the composition. Preferably, the tricarboxylic acid is present in an amount about 0.05 wt. % to about 3.0 wt. %, and more preferably about 0.1 wt. % to about 2.0 wt. %.

It has been found that the use of at least one carboxylic acid with a pKa between about 3 to about 6 in the cleaning composition of the present invention effectively and significantly reduces and/or eliminates corrosion on metal substrates.

Suitable carboxylic acids having formula (II) include, for example, formic, acetic, propionic, butyric, valeric acid, trimethylacetic, isovaleric, succinic, methylsuccinic, glutaric, suberic, glycolic, lactic, 2-hydroxyisobutyric, 3-hydroxybutyric, malic, citramalic, tartaric, ethoxyacetic, tetrahydro-3-furoic, diglycolic, mercaptosuccinic, thiolactic, cyclohexylacetic, dicyclohexylacetic, 1,1-cyclohexanediacetic. Preferred carboxylic acids having formula (II) include, for example, acetic acid, glycolic acid, lactic acid, succinic acid, malic acid, tartaric acid, and gluconic acid.

Carboxylic acid is present in the cleaning composition of the present invention in an amount about 0.01 wt. % to about 10.0 wt. %, based on the total weight of the composition. Preferably carboxylic acid is present in an amount about 0.05 wt. % to about 3.0 wt. %, and more preferably about 0.1 wt. % to about 2.0 wt. %.

It has been unexpectedly found that the combination of tricarboxylic acids of formula (I) and carboxylic acids of formula (II) in the cleaning composition of the present invention provide a synergistic effect resulting in enhanced cleaning properties to the composition, compared to compositions having only tricarboxylic acid or carboxylic acid alone.

Preferably, the ratio of tricarboxylic acid to carboxylic acid present in the compositions is about 1:5 to about 5:1. More preferably the ratio is about 1:3 to about 3:1. Most preferably, the ratio is about 1:1.

As such, the cleaning composition of the present invention is capable of not only effectively removing fresh residues from a metal substrate, it is effective at removing aged residues from a metal substrate, while not corroding the metal substrate. These enhanced properties are illustrated and summarized in Tables 3 and 4 below.

Water is present in the composition of the present invention in an amount about 80 wt. % to about 99.98 wt. %. Preferably, water is present in an amount about 90 to about 99.98 wt. %. More preferably, water is present in an amount about 94 wt. % to about 99.98 wt. % and most preferably 96 wt. % to about 99.98 wt. %.

Optionally, at least one hydroxylammonium compound can be included in the composition of the present invention. The hydroxylammonium compound, for example, may be a hydroxylammonium salt that has the formula (III):

$$r(NR^{10}R^{11}R^{12}OH)^+(X^{r-}) \qquad (III)$$

wherein $R^{10}$, $R^{11}$, and $R^{12}$ are individually selected from hydrogen, lower alkyl groups having 1 to 4 carbon atoms, lower alkoxy groups having 1 to 4 carbon atoms, hydroxyl and hydroxyl-substituted lower alkyl groups having 1 to 4 carbon atoms, with the proviso that at least two of $R^{10}$, $R^{11}$ and $R^{12}$ are either hydrogen, lower alkyl group or lower alkoxy group, and wherein X is an anionic moiety that forms a water-soluble salt with the hydroxyl ammonium cations or quaternary ammonium cations, and r is the valence of X and is from 1 to 3.

Suitable hydroxylammonium compounds that can be included in the cleaning composition of the present invention include, for example, hydroxylammonium salts, such as hydroxylammonium nitrate (also referred to as HAN), hydroxylammonium sulfate (also referred to as HAS), hydroxylammonium phosphate, hydroxylammonium chloride, hydroxylammonium oxalate, hydroxylammonium citrate, hydroxylammonium fluoride, N,N-diethylhydroxylammonium sulfate, N,N-diethylhydroxylammonium nitrate, and any combinations thereof.

When used in the composition of the present invention, the hydroxylammonium compound is present in an amount between about 0.001 wt. % to about 10 wt. %, based on the total weight of the composition. Preferably, the hydroxylammonium compound is present in an amount about 0.1 wt. % to about 0.5 wt. %, and most preferably about 0.1 wt. % to about 0.25 wt. %.

The present invention may optionally include at least one base compound. The base compound may be, for example, an amine or quaternary ammonium hydroxide. Amines that can be used as the base compound of the cleaning composition of the present invention include hydroxylamine and other alkanolamines such as monoethanolamine, diethanolamine, triethanolamine, diethylene-glycolamine, N-hydroxyethylpiperazine, and the like. Quaternary ammonium hydroxides that can be used as the base component of the cleaning composition of the present invention include tetraalkylammonium hydroxides having methyl, ethyl, propyl, butyl, hydroxyethyl, and the combinations thereof (e.g., tetramethylammonium hydroxide (hereinafter referred to as TMAH), tetraethylammonium hydroxide, trimethyl hydroxyethylammonium hydroxide, methyl tri (hydroxyethyl) ammonium hydroxide, tetra (hydroxyethyl) ammonium hydroxide, benzyl trimethylammonium hydroxide and the like). Additionally, a combination of ammonium hydroxide with one or more quaternary ammonium hydroxides may also be used.

When used in the composition of the present invention, the base compound is present in an amount between about 0.001 wt. % to about 1 wt. %, based on the total weight of the composition. Preferably, the base compound is present in an amount about 0.002 wt. % to about 0.5 wt. %.

The cleaning composition of the present invention may, optionally, include one or more solvents. Suitable solvents include, for example, polyol compounds or glycol ethers. Suitable polyol compounds useful in the present invention include any that are miscible with water. By the term "polyol compound" is meant a compound having two or more hydroxyl groups. By way of example, suitable polyol compounds include aliphatic polyol compounds such as ($C_2$-$C_{20}$) alkanediols, substituted ($C_2$-$C_{20}$) alkanediols, ($C_2$-$C_{20}$) alkanetriols, substituted ($C_2$-$C_{20}$) alkanetriols, and any combinations thereof. Suitable aliphatic polyol compounds include, for example, ethylene glycol, propylene glycol, diethylene glycol, dipropylene glycol, triethylene glycol, tripropylene glycol, 2-methyl-1,3-propanediol, butanediol, pentanediol, hexanediol, glycerol, and any combinations thereof.

When used in the composition of the present invention, the solvent is present in an amount between about 0.1 wt. % to about 30 wt. %, based on the total weight of the composition. Preferably, the solvent is present in an amount about 0.5 wt. % to about 10 wt. %.

The present invention may further include one or more additives. Suitable additives include, for example, chelating compounds or surface active agents that can enhance the effectiveness of the composition of the present invention in removing particulate and/or metallic contaminants from the wafer surface. Additives, such as, for example, nonionic surfactants, and notably chelating group attached polyoxyethylene type surfactant known as CS-1®, which is commercially available from BASF, can be used in the present invention.

When used in the composition of the present invention, the one or more additives are present in an amount between about 0.001 wt. % to about 10 wt. %, based on the total weight of the composition. Preferably, the one or more additives are present in an amount about 0.005 wt. % to about 1 wt. %.

The cleaning composition of the present invention has a pH about 1 to about 5. Preferably, the pH of the composition is about 1.5 to about 4. More preferably, the pH is about 1.5 to about 3, and most preferably about 1.8 to about 2.5.

In a preferred embodiment of the present invention, the present composition for removing plasma etch residues formed on a substrate comprises (a) about 90 wt. % to about 98 wt. % water; (b) about 0.4 wt. % to about 1.5 wt. % lactic acid; (c) about 0.5 wt. % to about 1.6 wt. % citric acid; and (d) about 0 wt. % to about 0.25 wt. % hydroxylammonium sulfate.

The cleaning compositions of the present invention may be effectively used at a wide range of temperatures, such as, but not limited to, up to about 80° C., preferably from about 20° C. to about 60° C., more preferably from about 22° C. to about 45° C., and most preferably from about 23° C. to about 35° C. An advantage of the cleaning compositions of the present invention is that they may be effectively used at ambient temperature.

Similarly, cleaning times can vary over a wide range depending on the particular cleaning method employed. When cleaning in an immersion batch type process, a suitable range is, for example, up to about 45 minutes. A preferred range for a batch type process is from about 1 minute to about 30 minutes. A more preferred range for a batch type process is from about 3 minutes to about 20 minutes. A most preferred range for a batch type cleaning process is from about 5 minutes to about 15 minutes.

Cleaning times for a single wafer process may range from about 10 seconds to about 5 minutes. A preferred cleaning time for a single wafer process may range from about 15 seconds to about 2 minutes. A more preferred cleaning time for a single wafer process may range from about 15 seconds to about 1 minute. A most preferred cleaning time for a single wafer process may range from about 30 to about 45 seconds.

The present invention is also directed to a method for removing both fresh and aged residue from a substrate, such as copper or aluminum. The method includes the steps of (a) providing a substrate with residue; and (b) contacting the substrate with a cleaning composition comprising water; and a synergistic combination of tricarboxylic acid having formula (I) and carboxylic acid having formula (II). Optionally, at least one hydroxylammonium compound having formula (III) may be included in the composition.

The substrate can be contacted with the cleaning composition by any suitable method, such as by placing the cleaning composition into a tank and immersing and/or submerging the substrates into the cleaning composition, spray rinsing the composition on the substrate, streaming the composition on the substrate, or any combinations thereof. Preferably, the substrates are spray rinsed with the cleaning composition.

The present invention also includes a cleaning method used in combination with the following photoresist stripping processes, which are typically conducted prior to the present cleaning method. Any suitable dry stripping process can be used, including $O_2$ plasma ashing, ozone gas phase-treatment, fluorine plasma treatment, hot $H_2$ gas treatment (described in U.S. Pat. No. 5,691,117 incorporated herein by reference), and the like. The preferred stripping process is $O_2$ plasma ashing.

In addition, the cleaning method can also be used in combination with an organic wet stripping method. Any conventional organic wet stripping solution can be used and a person skilled in the art would be able to choose the appropriate organic wet stripper. The preferred wet stripping process is treatment with ozonated water in combination with the cleaning composition of the present invention. Thus, the cleaning method of the invention can be used to replace the organic solvent-based post-strip rinse.

This is preferred because the cleaning composition is a non-corrosive, weakly acidic aqueous solution that will not harm the environment. Furthermore, the cleaning compositions used in the present cleaning method may be disposed of in a regular drain system for aqueous chemical wastes.

To illustrate the present invention, the following examples are provided. It should be understood that the present invention is not limited to the examples described.

EXAMPLE 1

1000 grams of a cleaning solution was prepared by dissolving 5.68 grams (0.0555 moles) 88 wt. % aqueous solution of lactic acid, 15 grams (0.781 moles) citric acid in a mixture of 7.83 grams (0.0143 moles as 100%) of a 30 wt. % aqueous solution of hydroxylammonium sulfate and 971.49 grams deionized water. This solution was used, as is, in subsequent testing.

EXAMPLE 2

1000 grams of a cleaning solution was prepared by dissolving 11.36 grams (0.111 moles) 88 wt. % aqueous solution of lactic acid, 10 grams (0.0521 moles) citric acid in a mixture of 7.83 grams (0.0143 moles as 100%) of a 30 wt. % aqueous solution of hydroxylammonium sulfate and 970.81 grams deionized water. This solution was used, as is, in subsequent testing.

EXAMPLE 3

1000 grams of a cleaning solution was prepared by dissolving 17.05 grams (0.1665 moles) 88 wt. % aqueous solution of lactic acid, 5 grams (0.026 moles) citric acid in a mixture of 7.83 grams (0.0143 moles as 100%) of a 30 wt. % aqueous solution of hydroxylammonium sulfate and 970.12 grams deionized water. This solution was used, as is, in subsequent testing.

EXAMPLE 4

1000 grams of a cleaning solution was prepared by dissolving 11.36 grams (0.111 moles) 88 wt. % aqueous solution of lactic acid, 10 grams (0.0521 moles) citric acid in 978.64 grams deionized water. This solution was used, as is, in subsequent testing.

EXAMPLE 5

1000 grams of a cleaning solution was prepared by dissolving 6.67 grams (0.111 moles) of glacial acetic acid, 10 grams (0.0521 moles) citric acid in a mixture of 7.83 grams (0.0143 moles as 100%) of a 30 wt. % aqueous solution of hydroxylammonium sulfate and 975.5 grams deionized water. This solution was used, as is, in subsequent testing.

EXAMPLE 6

1000 grams of a cleaning solution was prepared by dissolving 8.44 grams (0.111 moles) of glycolic acid, 10 grams (0.0521 moles) citric acid in a mixture of 7.83 grams (0.0143 moles as 100%) of a 30 wt. % aqueous solution of hydroxylammonium sulfate and 973.73 grams deionized water. This solution was used, as is, in subsequent testing.

EXAMPLE 7

1000 grams of a cleaning solution was prepared by dissolving 14.88 grams (0.111 moles) of malic acid, 10 grams (0.0521 moles) citric acid in a mixture of 7.83 grams (0.0143 moles as 100%) of a 30 wt. % aqueous solution of hydroxylammonium sulfate and 967.29 grams deionized water. This solution was used, as is, in subsequent testing.

EXAMPLE 8

1000 grams of a cleaning solution was prepared by dissolving 13.11 grams (0.111 moles) of succinic acid, 10 grams (0.0521 moles) citric acid in a mixture of 7.83 grams (0.0143 moles as 100%) of a 30 wt. % aqueous solution of hydroxylammonium sulfate and 969.06 grams deionized water. This solution was used, as is, in subsequent testing.

COMPARATIVE EXAMPLE 1

1000 grams of a cleaning solution was prepared by dissolving 20 grams (0.263 moles) glycolic acid in a mixture of 7.83 grams (0.0143 moles as 100%) of a 30 wt. % aqueous solution of hydroxylammonium sulfate and 972.17 grams deionized water. This solution was used, as is, in subsequent testing.

COMPARATIVE EXAMPLE 2

1000 grams of a cleaning solution was prepared by dissolving 20.06 grams (0.15 moles) DL-malic acid in a mixture of 7.83 grams (0.0143 moles as 100%) of a 30 wt. % aqueous solution of hydroxylammonium sulfate and 972.17 grams deionized water. This solution was used, as is, in subsequent testing.

COMPARATIVE EXAMPLE 3

1000 grams of a cleaning solution was prepared by dissolving 20.03 grams (0.134 moles) L-tartaric acid in a mixture of 7.83 grams (0.0143 moles as 100%) of a 30 wt. % aqueous solution of hydroxylammonium sulfate and 972.17 grams deionized water. This solution was used, as is, in subsequent testing.

COMPARATIVE EXAMPLE 4

743.6 grams of a cleaning solution was prepared by dissolving 31.31 grams (0.076 moles) 45-50 wt. % aqueous solution of D-gluconic acid in a mixture of 5.82 grams (0.035 moles as 100%) of a 30 wt. % aqueous solution of hydroxylammonium sulfate and 706.43 grams deionized water. This solution was used, as is, in subsequent testing.

COMPARATIVE EXAMPLE 5

1000 grams of a cleaning solution was prepared by dissolving 20.02 grams (0.17 moles) succinic acid in a mixture of 7.83 grams (0.0143 moles as 100%) of a 30 wt. % aqueous solution of hydroxylammonium sulfate and 972.17 grams deionized water. This solution was used, as is, in subsequent testing.

COMPARATIVE EXAMPLE 6

1000 grams of a cleaning solution was prepared by dissolving 20.03 grams (0.33 moles) glacial acetic acid in a mixture of 7.8 grams (0.0143 moles as 100%) of a 30 wt. % aqueous solution of hydroxylammonium sulfate and 972.3 grams deionized water. This solution was used, as is, in subsequent testing.

COMPARATIVE EXAMPLE 7

1000 grams of a cleaning solution was prepared by dissolving 22.72 grams (0.222 moles) 88 wt. % aqueous solution of lactic acid in a mixture of 7.83 grams (0.0143 moles as 100%) of a 30 wt. % aqueous solution of hydroxylammonium sulfate and 969.44 grams deionized water. This solution was used, as is, in subsequent testing.

COMPARATIVE EXAMPLE 8

1000 grams of a cleaning solution was prepared by dissolving 10.0 grams (0.111 moles) of oxalic acid, 10.0 grams (0.052 moles) citric acid in a mixture of 7.83 grams (0.0143 moles as 100%) of a 30 wt. % aqueous solution of hydroxylammonium sulfate and 972.17 grams deionized water. This solution was used, as is, in subsequent testing.

COMPARATIVE EXAMPLE 9

1000 grams of a cleaning solution was prepared by dissolving 20.0 grams (0.222 moles) of oxalic acid in a mixture of 7.83 grams (0.0143 moles as 100%) of a 30 wt. % aqueous solution of hydroxylammonium sulfate and 972.17 grams deionized water. This solution was used, as is, in subsequent testing.

COMPARATIVE EXAMPLE 10

1000 grams of a cleaning solution was prepared by dissolving 20.03 grams (0.095 moles) citric acid in a mixture of 7.83 grams (0.0143 moles as 100%) of a 30 wt. % aqueous solution of hydroxylammonium sulfate and 972.17 grams deionized water. This solution was used, as is, in subsequent testing.

COMPARATIVE EXAMPLE 11

1000 grams of a cleaning solution was prepared by dissolving 10.0 grams (0.111 moles) of oxalic acid, 10 grams (0.0847 moles) succinic acid in a mixture of 7.83 grams (0.0143 moles as 100%) of a 30 wt. % aqueous solution of hydroxylammonium sulfate and 972.17 grams deionized water. This solution was used, as is, in subsequent testing.

COMPARATIVE EXAMPLE 12

1000 grams of a cleaning solution was prepared by dissolving 10.0 grams (0.111 moles) of oxalic acid, 11.36 grams (0.111 moles) 88 wt. % aqueous solution of lactic acid in a mixture of 7.83 grams (0.0143 moles as 100%) of a 30 wt. % aqueous solution of hydroxylammonium sulfate and 970.81 grams deionized water. This solution was used, as is, in subsequent testing.

COMPARATIVE EXAMPLE 13

1000 grams of a cleaning solution was prepared by dissolving 20.00 grams (0.095 moles) citric acid in a mixture of 7.83 grams (0.0143 moles as 100%) of a 30 wt. % aqueous solution of hydroxylammonium sulfate, 0.094 grams of a 25 wt. % aqueous solution of tetramethylammonium hydroxide and 972.072 grams de-ionized water.

Weight Loss Method for the Determination of Copper and Aluminum Metal Substrate Compatibility with Cleaning Solutions Substrates used in these tests were obtained from Wafer-Net, Inc. The substrates used in these tests were 4 inch silicon wafers that were blanket-coated with approximately 5056 Angstroms copper or 4915 Angstroms aluminum.

Approximately 800 mL of cleaning solution was placed in a 1000 mL glass beaker. A 3.7 cm long magnetic stir bar was introduced into the beaker. The beaker containing the cleaning solution and magnetic stir bar was placed on a RET Control-Visc S1® model constant temperature/constant speed hotplate/stirrer (IKA® Works, Inc.). The temperature of the cleaning solution was adjusted and maintained at 23° C. The stirring rate was maintained at 200 rpm.

Test substrates were ultrasonically precleaned for 5 minutes in an acetone bath. The precleaned wafers were rinsed with a copious amount of deionized water then dried in a stream of nitrogen. The weight of the precleaned wafers was determined to ±0.01 mg ("$W_i$"). The wafers were immersed in the cleaning solution for 15 minutes (23° C./200 rpm). The wafer was then removed and rinsed for 5 minutes in a stream of fresh deionized water. The water rinsed wafers were dried in a stream of nitrogen. The weight of the dried processed wafers was once again determined to ±0.01 mg ("$W_f$"). The etch of the metal substrates was then calculated using the following equations:

$$\text{Copper Etch Rate (Angstroms/min)} = (137662.1983) \times (W_i - W_f)/15 \text{ min}$$

$$\text{Aluminum Etch Rate (Angstroms/min)} = (457020.7403) \times (W_i - W_f)/15 \text{ min}$$

Etch Rates per Mole of Acid that are summarized in Table 1, were determined as follows: Aluminum (or Copper) Etch Rate/(moles of acid per 1000 g of cleaning solution).

TABLE 1

| | Acid | Copper Etch Rate per mole acid (Ang/min/mole) | Aluminum Etch Rate per mole acid | pKa1 | PKa2 | pKa3 |
|---|---|---|---|---|---|---|
| Comparative Example 1 | HOCH$_2$CO$_2$H | 17.8 | 12.7 | 3.83 | | |
| Comparative Example 2 | HO$_2$CCH$_2$CHCO$_2$H<br>                    \|<br>                    OH | 24.07 | 2.02 | 3.48 | 5.1 | |
| Comparative Example 3 |          OH<br>         \|<br>HO$_2$CCHCHCO$_2$H<br>           \|<br>          OH | 31.5 | 0 | 3.22 | 4.81 | |
| Comparative Example 4 |             OH  OH<br>            \|    \|<br>HOCH$_2$CHCHCHCHCO$_2$H<br>                \|    \|<br>               OH  OH | 35.79 | | 3.86 | | |
| Comparative Example 5 | HO$_2$CCH$_2$CH$_2$CO$_2$H | 14.79 | 0 | 4.21 | 5.64 | |
| Comparative Example 6 | CH$_3$CO$_2$H | 20.58 | 2.74 | 4.76 | | |
| Comparative Example 7 | CH$_3$CH(OH)CO$_2$OH | 18.77 | 14.98 | 3.86 | | |
| Comparative Example 9 | HO$_2$CCO$_2$H | 84.08 | 14.85 | 1.271 | 4.272 | |
| Comparative Example 10 |         CH$_2$CO$_2$H<br>        \|<br>HO—CCO$_2$H<br>        \|<br>        CH$_2$CO$_2$H | 26.08 | 8.75 | 3.128 | 4.76 | 6.39 |

The data contained in Table 3 show acids that having pKa values less than 3.0 are very corrosive to copper substrates and are unacceptable for use in the present invention.

Post Ash Residue Cleaning Efficiency Method 1

Patterned and etched dual damascene copper and low k wafers obtained from Sematech International were used for these tests. The damascene thin film stack is described in Table 2.

TABLE 2

| Film | Layer Description | Thickness (Angstroms) |
|---|---|---|
| SiCN-SiC | Capping Layer | ~2500 |
| Porous MSQ | Inter-layer dielectric | ~3000–4000 |
| SiCN | Trench etch stop | ~1000 |
| Porous MSQ | Inter-layer dielectric | ~3000–4000 |
| SiCN | Via etch stop | ~1000 |
| Copper | Metal | ~4000 |

Photoresist, process materials and chemistries are described in Table 3.

TABLE 3

| | |
|---|---|
| BARC: | Brewer DUV 30 ® |
| Photoresist: | Shipley UV6 ® |
| Etch Chemistry: | $C_4F_8$ RIE |
| Ash Chemistry: | $N_2/H_2$ Ash |

Etched via dimension is approximately 0.25 micrometers in diameter and etch trench dimension is approximately 1.5 micrometers.

Approximately 800 mL of cleaning solution was placed in a 1000 mL glass beaker. A 3.7 cm long magnetic stir bar was introduced into the beaker. The beaker containing the cleaning solution and magnetic stir bar was placed on a RET Control-Visc S1® Model constant temperature/constant speed hotplate/stirrer (IKA® Works, Inc.). The temperature of the cleaning solution was adjusted and maintained at 23° C. The stirring rate was maintained at 200 rpm.

Post-ash, test substrates were cut into pieces. Individual pieces of the test substrate were placed in a 6.7 cm diameter, polypropylene basket. The basket containing the piece of test substrate was then immersed in the cleaning solution for 15 minutes (23° C./200 rpm). The basket was then removed and rinsed in a cascade deionized water bath for 5 minutes. The water rinsed pieces of test substrate were dried in a stream of nitrogen. A thin layer of gold was sputtered on to the dried piece of test substrate. The relative degree of removal of post ash residues was estimated by examining the gold-coated piece of test substrate at 30,000× to 100,000× using a Hitachi Scanning Electron Microscope. The results are summarized in Table 4.

TABLE 4

| | Relative Degree of Post Ash Residue Removed[1] "Aged" Substrates | Relative Degree of Post Ash Residue Removed[1] "Fresh" Substrates |
|---|---|---|
| Comparative Example 7 | 2 | |
| Example 1 | 4 | |
| Example 2 | 1 | |
| Example 3 | 3 | |
| Example 4 | | 2 |
| Example 5 | 3 | 1 |
| Example 6 | 2 | 1 |
| Example 7 | 2 | 1 |
| Example 8 | 3 | 1 |
| Comparative Example 8 | Excessive attack on copper substrate | |
| Comparative Example 10 | 5 | |
| Comparative Example 11 | Excessive attack on copper substrate | |
| Comparative Example 12 | Excessive attack on copper substrate | |

[1]Scale:
1 = complete removal of post ash residue.
5 = no removal of post ash residue.

The data contained in Table 4 show that, for demanding substrates (i.e., "aged" substrates), the blend of a carboxylic having pKa values ranging from about 3 to about 6 with a tricarboxylic acid are superior in cleaning efficiency to a formulation containing only a tricarboxylic acid. Additionally, comparison of the results obtained for Example 2 with the results for Comparative Example 7 and Comparative Example 10 clearly demonstrates the superior performance realized by the blend of a tricarboxylic acid and a carboxylic acid having pKa values ranging from about 3 to about 6 of the present invention, compared to compositions containing a single acid component.

For less demanding substrates (i.e., "fresh" substrates), the blend of a carboxylic having pKa values ranging from about 3 to about 6 with a tricarboxylic acid is efficient enough to obviate the need to use an hydroxylammonium compound.

The formulation of Example 2 was also tested for post ash residue cleaning efficiency using Methods 2 and 3 below. The results are reported in Table 5.

Post Ash Residue Cleaning Efficiency Method 2

Method 2 is identical to Method 1 above except for the following. The temperature of the cleaning solution was varied as described in the Table 5. Wafer pieces were placed within the prongs of plastic tweezers and immersed into the cleaning solution for a specific time as noted in Table 5. Cleaning was accompanied by high agitation in the following manner. The wafer portion was moved in a forward and upward motion, followed by a downward and backward wrist motion at an approximate frequency of 60 to 100 times per minute. The plane of the wafer piece was positioned in a 90° angle to the plane of the motion. This method was employed to mimic in a beaker the high agitation found in a single wafer process.

Post Ash Residue Cleaning Efficiency Method 3

This method employed the SemiTool Equinox Millennium, a single wafer tool, with 8 inch wafers as described in Method 1. The process was carried out at a temperature of 21°

C. The cleaning solution was allowed to flow over the wafer at a flow rate of 250 milliliter/minute for 30 seconds. Subsequently, the cleaning solution was recovered from the wafer during a 15 second period. This was followed by a de-ionized water rinse for 55 seconds and then the wafer was spun dry for 45 seconds at 1800 rpm. Wafers were cut into pieces, sputtered with a thin layer of gold and inspected on a Hitachi Scanning Electron Microscope as described in Method 1. The result is given in Table 5.

TABLE 5

| | | Cleaning Temperature | Time | Result |
|---|---|---|---|---|
| Comparative Example 13 | Method 2 | 23° C. | 2 minutes | Not all residue removed |
| Example 2 | Method 2 | 23° C. | 2 minutes | No residue |
| Example 2 | Method 2 | 40° C. | 2 minutes | No residue |
| Example 2 | Method 2 | 40° C. | 1 minutes | No residue |
| Example 2 | Method 2 | 40° C. | 30 seconds | No residue |
| Example 2 | Method 3 | 21° C. | 30 seconds | No residue |

The data in Table 5 illustrates that the prior art cleaner (Comparative Example 13) does not completely clean in a two minute period. The cleaning composition of this invention with the combination of a carboxylic acid with a tricarboxylic acid completely cleans post ashing residue in 30 seconds. Cleaners employed in single wafer tools have a requirement of short (less than 2 minute) cleaning time to be commercially viable, and the compositions of the present invention meet this demanding requirement.

It should be understood that the foregoing description is only illustrative of the present invention. Various alternatives and modifications can be devised by those skilled in the art without departing from the invention. Accordingly, the present invention is intended to embrace all such alternatives, modifications and variances.

We claim:

1. A non-corrosive cleaning composition consisting of:
    (a) water;
    (b) a combination of at least one tricarboxylic acid and at least one carboxylic acid, wherein said at least one carboxylic acid is selected from the group consisting of: acetic, propionic, butyric, valeric, trimethylacetic, isovaleric, succinic, methylsuccinic, glutaric, suberic, glycolic, 2-hydroxyisobutyric, 3-hydroxybutyric, malic, citramalic, tartaric, ethoxyacetic, tetrahydro-3-furoic, diglycolic, mercaptosuccinic, thiolactic, cyclohexylacetic, dicyclohexylacetic, and 1,1-cyclohexanediacetic, and said at least one tricarboxylic acid and said at least one carboxylic acid is present in a weight ratio of about 1:5 to about 5:1; and
    (c) at least one solvent selected from the group consisting of polyol compounds, glycol ethers, and any combinations thereof; and
    (d) optionally, at least one surfactant.
2. The composition of claim 1, wherein said composition removes an etch residue from a substrate.
3. The composition of claim 2, wherein said etch residue is a plasma etch residue.
4. The composition of claim 1, wherein said combination of said at least one tricarboxylic acid and at least one carboxylic acid provides an enhanced cleaning composition compared to a cleaning composition having only tricarboxylic acid or carboxylic acid alone.
5. The composition of claim 1, wherein said at least one tricarboxylic acid has the formula:

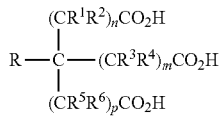

wherein n, m, and p, are each integers independently ranging from 1 to 6; R, $R^1$, $R^2$, $R^3$, $R^4$, $R^5$, and $R^6$ are each independently selected from the group consisting of hydrogen, hydroxyl, mercapto, alicyclic or cyclic thioethers having 1 to 6 carbon atoms, lower alkoxy groups having 1 to 4 carbon atoms, lower branched or linear alkyl groups having 1 to 4 carbon atoms, cyclic alkyl groups having 3 to 6 carbon atoms, phenyl, aryl, nitro and halogen.

6. The composition of claim 5, wherein said at least one tricarboxylic acid having said formula is selected from the group consisting of: tricarballylic acid, beta-methyltricarballylic acid, citric acid, nitromethanetrispropionic acid, and 2-(carboxylmethylthio) succinic acid.
7. The composition of claim 1, wherein said at least one tricarboxylic acid is present in said composition in an amount about 0.01 wt. % to about 10 wt. %.
8. The composition of claim 1, wherein said at least one tricarboxylic acid is present in said composition in an amount about 0.05 wt. % to about 3 wt. %.
9. The composition of claim 1, wherein said at least one tricarboxylic acid is present in said composition in an amount about 0.1 wt. % to about 2 wt. %.
10. The composition of claim 1, wherein said at least one carboxylic acid is present in said composition in an amount about 0.01 wt. % to about 10 wt. %.
11. The composition of claim 1, wherein said at least one carboxylic acid is present in said composition in an amount about 0.05 wt. % to about 3 wt. %.
12. The composition of claim 1, wherein said at least one carboxylic acid is present in said composition in an amount about 0.1 wt. % to about 2 wt. %.
13. The composition of claim 1, wherein said at least one tricarboxylic acid and said at least one carboxylic acid is present in said composition in a weight ratio of about 1:3 to about 3:1.
14. The composition of claim 1, wherein said at least one tricarboxylic acid and said at least one carboxylic acid is present in said composition in a weight ratio of about 1:1.
15. A non-corrosive cleaning composition consisting of:
    (a) water;
    (b) a combination of at least one tricarboxylic acid and at least one carboxylic acid which is different from the at least one tricarboxylic acid, said at least one tricarboxylic acid and said at least one carboxylic acid being present in a weight ratio of about 1:5 to about 5:1, said at least one tricarboxylic acid is at least citric acid and being present in said composition in an amount about 0.05 wt. % to about 3 wt. %, said at least one carboxylic acid being present in said composition in an amount about 0.05 wt. % to about 3 wt. %, and all of the pKa values of said at least one carboxylic acid ranging from about 3 to about 6;
    (c) at least one hydroxylammonium compound having the formula:

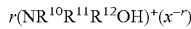

$R^{10}$, $R^{11}$, and $R^{12}$ are individually selected from hydrogen, lower alkyl groups having 1 to 4 carbon atoms, lower alkoxy groups having 1 to 4 carbon atoms, hydroxyl and hydroxyl-substituted lower alkyl groups having 1 to 4 carbon atoms, with the proviso that at least two of $R^{10}$, $R^{11}$, and $R^{12}$ are either hydrogen, lower alkyl group or lower alkoxy group, X is an anionic moiety that forms a water-soluble salt with the hydroxylammonium cations or quaternary ammonium cations, and r is the valence of X and is from 1 to 3; and optionally, (d) at least one component selected from the group consisting of: a surfactant, and a solvent and combinations thereof, the solvent being selected from the group consisting of polyol compounds, glycol ethers, and any combinations thereof, and the polyol compounds are selected from the group consisting of ($C_2$-$C_{20}$) alkanediols and ($C_2$-$C_{20}$) alkanetriols.

16. The composition of claim 15, wherein said at least one hydroxylammonium compound is at least one selected from the group consisting of hydroxylammonium salts, hydroxylammonium nitrate, hydroxylammonium sulfate, hydroxylammonium phosphate, hydroxylammonium chloride, hydroxylammonium oxalate, hydroxylammonium citrate, hydroxylammonium fluoride, N,N-diethylhydroxylammonium sulfate, and N,N-diethylhydroxylammonium nitrate.

17. The composition of claim 15, wherein said at least one hydroxylammonium compound is present in an amount about 0.001 wt. % to about 10 wt. %.

18. A non-corrosive cleaning composition consisting of:
(a) water;
(b) a combination of at least one tricarboxylic acid and at least one carboxylic acid, and
(c) at least one solvent,
wherein the at least one carboxylic acid is selected from the group consisting of: acetic, propionic, butyric, valeric, trimethylacetic, isovaleric, succinic, methylsuccinic, glutaric, suberic, glycolic, lactic, 2-hydroxyisobutyric, 3-hydroxybutyric, malic, citramalic, tartaric, ethoxyacetic, tetrahydro-3-furoic, diglycolic, mercaptosuccinic, thiolactic, cyclohexylacetic, dicyclohexylacetic, and 1,1-cyclohexanediacetic, the at least one solvent is selected from the group consisting of polyol compounds, glycol ethers, and any combinations thereof, and said at least one tricarboxylic acid and said at least one carboxylic acid is present in a weight ratio of about 1:5 to about 5:1.

19. The composition of claim 18, wherein said solvent is present in said composition in an amount about 0.1 wt. % to about 30 wt. %.

20. A non-corrosive cleaning composition for removing plasma etch residue on a substrate consisting of
water,
a combination of lactic acid and citric acid, the lactic acid being present in the composition in an amount about 0.05 wt. % to about 3 wt. % and the citric acid being present in the composition in an amount about 0.05 wt. % to about 3 wt. %,
at least one hydroxylammonium compound present in said composition in an amount about 0.001 wt. % to about 10 wt. %, and
optionally, at least one component selected from a group consisting of: a surfactant, a solvent, and combinations thereof, the solvent being selected from the group consisting of polyol compounds, glycol ethers, and any combinations thereof, and the polyol compounds are selected from the group consisting of ($C_2$-$C_{20}$) alkanediols and ($C_2$-$C_{20}$) alkanetriols.

21. The composition of claim 20, wherein said at least one hydroxylammonium compound is hydroxylammonium sulfate.

22. A non-corrosive cleaning composition consisting of:
(a) water;
(b) a combination of at least one tricarboxylic acid and at least one carboxylic acid, wherein said at least one carboxylic acid is selected from the group consisting of: propionic, butyric, valeric, trimethylacetic, isovaleric, succinic, methylsuccinic, glutaric, suberic, glycolic, 2-hydroxyisobutyric, 3-hydroxybutyric, citramalic, tartaric, ethoxyacetic, tetrahydro-3-furoic, diglycolic, mercaptosuccinic, thiolactic, cyclohexylacetic, dicyclohexylacetic, and 1,1-cyclohexanediacetic, said at least one tricarboxylic acid is at least citric acid and is present in said composition in an amount about 0.05 wt. % to about 3 wt. %, said at least one carboxylic acid is present in said composition in an amount about 0.05 wt. % to about 3 wt. %, and said at least one tricarboxylic acid and said at least one carboxylic acid is present in a weight ratio of about 1:5 to about 5:1; and
(c) at least one non-ionic surfactant.

23. The composition of claim 22, wherein the surfactant has a polyoxyethylene group.

24. A non-corrosive cleaning composition consisting of:
(a) water;
(b) a combination of at least one tricarboxylic acid and at least one carboxylic acid, said at least one tricarboxylic acid and said at least one carboxylic acid being present in a weight ratio of about 1:5 to about 5:1, wherein said at least one carboxylic acid is selected from the group consisting of: acetic, propionic, butyric, valeric, trimethylacetic, isovaleric, succinic, methylsuccinic, glutaric, suberic, glycolic, 2-hydroxyisobutyric, 3-hydroxybutyric, malic, citramalic, tartaric, ethoxyacetic, tetrahydro-3-furoic, diglycolic, mercaptosuccinic, thiolactic, cyclohexylacetic, dicyclohexylacetic, and 1,1-cyclohexanediacetic, said at least one tricarboxylic acid is at least citric acid and is present in said composition in an amount about 0.05 wt. % to about 3 wt. %, said at least one carboxylic acid is present in said composition in an amount about 0.05 wt. % to about 3 wt. %;
(c) at least one hydroxylammonium compound having the formula:

$r(NR^{10}R^{11}R^{12}OH)^+(x^{-r})$ wherein $R^{10}$, $R^{11}$, and $R^{12}$ are individually selected from hydrogen, lower alkyl groups having 1 to 4 carbon atoms, lower alkoxy groups having 1 to 4 carbon atoms, hydroxyl and hydroxyl-substituted lower alkyl groups having 1 to 4 carbon atoms, with the proviso that at least two of $R^{10}$, $R^{11}$, and $R^{12}$ are either hydrogen, lower alkyl group or lower alkoxy group, X is an anionic moiety that forms a water-soluble salt with the hydroxylammonium cations or quaternary ammonium cations, and r is the valence of X and is from 1 to 3; and optionally, at least one component selected from the group consisting of: a surfactant, and a solvent and combinations thereof, the solvent being selected from the group consisting of polyol compounds, glycol ethers, and any combinations thereof, wherein the polyol compounds are selected from the group consisting of ($C_2$-$C_{20}$) alkanediols and ($C_2$-$C_{20}$) alkanetriols.

25. The composition of claim 24, wherein said at least one hydroxylammonium compound is at least one selected from the group consisting of: hydroxylammonium salts, hydroxylammonium nitrate, hydroxylammonium sulfate, hydroxylammonium phosphate, hydroxylammonium chloride, hydroxylammonium oxalate, hydroxylammonium citrate, hydroxylammonium fluoride, N,N-diethylhydroxylammonium sulfate, and N,N-diethylhydroxylammonium nitrate.

26. The composition of claim 24, wherein said at least one hydroxylammonium compound is present in an amount about 0.001 wt. % to about 10 wt. %.

* * * * *

UNITED STATES PATENT AND TRADEMARK OFFICE
CERTIFICATE OF CORRECTION

| | | |
|---|---|---|
| PATENT NO. | : 7,935,665 B2 | Page 1 of 1 |
| APPLICATION NO. | : 10/421506 | |
| DATED | : May 3, 2011 | |
| INVENTOR(S) | : Vincent G. Leon | |

It is certified that error appears in the above-identified patent and that said Letters Patent is hereby corrected as shown below:

Column 14, Line 61
In Claim 15, delete "$R^{10}$" and insert -- wherein $R^{10}$ -- therefor.

Column 15, Line 12
In Claim 16, delete "of" and insert -- of: -- therefor.

Signed and Sealed this
Twenty-eighth Day of June, 2011

David J. Kappos
*Director of the United States Patent and Trademark Office*